(12) United States Patent
Yu et al.

(10) Patent No.: US 11,145,660 B2
(45) Date of Patent: Oct. 12, 2021

(54) DUAL-PORT SRAM CELL STRUCTURE

(71) Applicant: Taiwan Semiconductor Manufacturing Co., Ltd., Hsinchu (TW)

(72) Inventors: Dian-Sheg Yu, Hsinchu (TW); Ren-Fen Tsui, Taipei (TW); Jhon Jhy Liaw, Hsinchu County (TW); Bing-Chian Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 168 days.

(21) Appl. No.: 16/527,371

(22) Filed: Jul. 31, 2019

(65) Prior Publication Data
US 2021/0035986 A1    Feb. 4, 2021

(51) Int. Cl.
   *H01L 27/11*      (2006.01)
(52) U.S. Cl.
   CPC .............................. *H01L 27/1104* (2013.01)
(58) Field of Classification Search
   CPC .................................................. H01L 27/1104
   See application file for complete search history.

(56) References Cited

U.S. PATENT DOCUMENTS

| | | | |
|---|---|---|---|
| 8,315,084 B2 | 11/2012 | Liaw et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,646,974 B1 | 5/2017 | Liaw | |
| 2016/0027499 A1* | 1/2016 | Liaw | G11C 8/16 365/154 |
| 2017/0221905 A1* | 8/2017 | Chen | H01L 21/823821 |

* cited by examiner

*Primary Examiner* — Lex H Malsawma
(74) *Attorney, Agent, or Firm* — Haynes and Boone, LLP

(57) ABSTRACT

A dual-port SRAM includes a substrate, first and second active regions over the substrate and oriented lengthwise generally along a first direction; first and second gate electrodes oriented lengthwise generally along a second direction perpendicular to the first direction. The first and second gate electrodes engage the first and second active regions to form first and second pass gate transistors, respectively. The dual-port SRAM further includes a first gate contact disposed over the first gate electrode and electrically connected to the first gate electrode and a first source/drain contact oriented lengthwise generally along the second direction. The first source/drain contact directly contacts source/drain features of the first and second pass gate transistors. A portion of the first gate contact and a portion of the first source/drain contact are at a same vertical level from a top surface of the substrate and are aligned along the first direction.

20 Claims, 10 Drawing Sheets

DUAL-PORT SRAM CELL STRUCTURE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, static random-access memory (SRAM) cells are frequently integrated into semiconductor devices for increased functional density. Such applications range from industrial and scientific subsystems, automotive electronics, cell phones, digital cameras, microprocessors, and so on. To meet the demand for higher SRAM density, continued scalding down of the semiconductor feature size as well as continued optimization of the layout and routing of the SRAM cells are needed.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
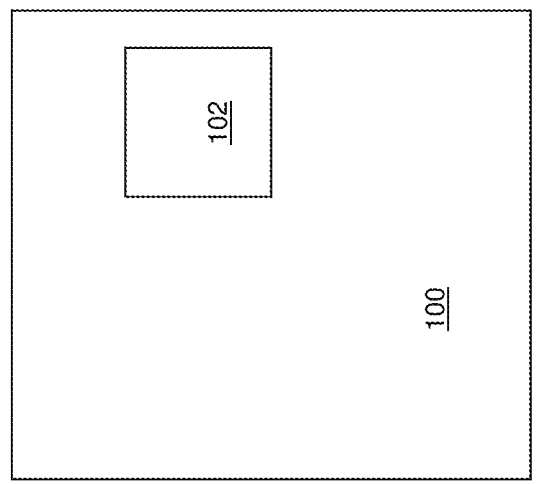
FIG. 1 is a simplified block diagram of an integrated circuit (IC) with embedded SRAM cells, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to an integrated circuit (IC) having embedded SRAM cells or SRAM macros. The layout of the SRAM cells is more optimized than other designs by taking advantage of the high resolution of advanced lithography such as extreme ultraviolet lithograph (EUV) that provides a resolution of 20 nm or less such as sub-8 nm in a single exposure. Such resolution cannot be realized by 193 nm immersion lithography unless multiple patterning is used. Further, using single exposure reduces variations caused by possible misalignment in multiple patterning. Particularly, the layout of the SRAM cell of the present embodiment simplifies metal routing over other designs.

Figure 2:
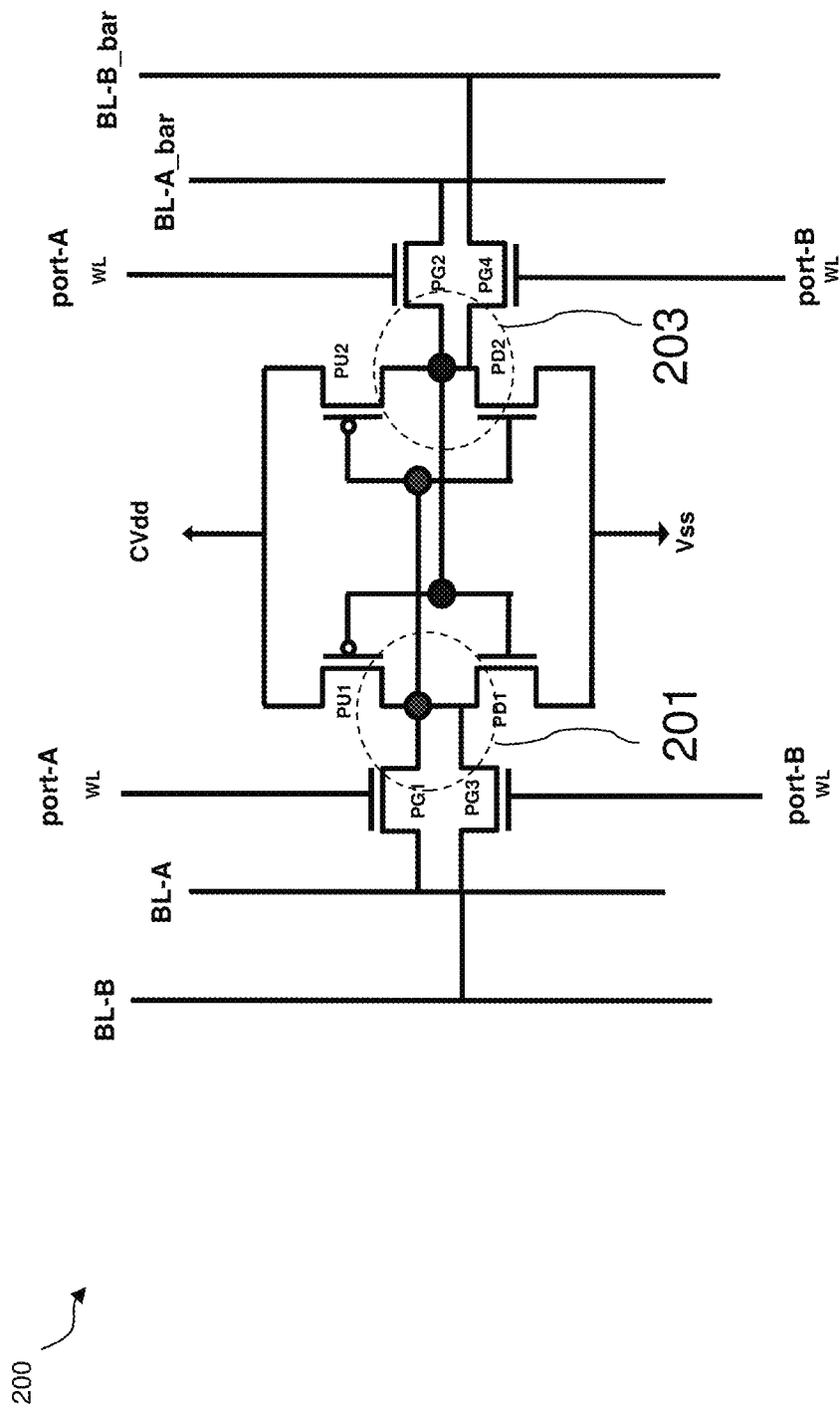
FIG. 2 shows a schematic view of a dual-port (DP) SRAM cell, in accordance with an embodiment.

FIG. 1 shows a semiconductor device 100 with an SRAM macro 102. The semiconductor device can be, e.g., a microprocessor, an application specific integrated circuit (ASIC), a field programmable gate array (FPGA), or a digital signal processor (DSP). The exact functionality of the semiconductor device 100 is not a limitation to the provided subject matter. The SRAM macro 102 includes a plurality of dual-port SRAM cells, an example schematic view of which is shown in FIG. 2. The SRAM macro 102 may also include other types of SRAM cells such as single-port SRAM cells (not shown) as well as a plurality of peripheral logic circuits (not shown). The SRAM cells are used to store memory bits, while the peripheral logic circuits are used to implement various logic functions, such as write and/or read address decoder, word/bit selector, data drivers, memory self-testing, etc. Each of the SRAM cells and the logic circuits may be implemented using planar transistors, FinFET, gate-all-around (GAA) nanosheet transistors, GAA nanowire transistors, or other types of transistors. Further, each of the SRAM cells and the logic circuits may include various contact features (or contacts), vias, and metal lines for connecting the source, drain, and gate electrodes (or terminals) of the transistors to form an integrated circuit.

FIG. 2 illustrates a schematic view of a dual-port (DP) SRAM cell 200. The DP SRAM cell 200 includes eight transistors (8T). Thus, it is also referred to as an 8T DP SRAM. In various embodiments, the DP SRAM cell 200 may be implemented with 8 or more transistors. Referring to FIG. 2, the 8T DP SRAM cell 200 includes two PMOSFETs (such as PMOS FinFETs) as pullup transistors, PU1 and PU2; two NMOSFETs (such as NMOS FinFETs) as pulldown transistors, PD1 and PD2; two NMOSFETs (such as NMOS FinFETs) as pass gate transistors, PG1 and PG2; and two NMOSFETs (such as NMOS FinFETs) as pass gate transistors, PG3 and PG4. The PU1 and PD1 are coupled to form an inverter (Inverter-1). The PU2 and PD2 are coupled to form another inverter (Inverter-2). The inverters, Inverter-1 and Inverter-2, are cross-coupled to form a storage unit of the DP SRAM cell 200. The DP SRAM cell 200 has two ports, Port A and Port B. The source or drain electrodes of the PG1 and PG2 are connected to Port A bit lines BL-A and BL-A_bar. The gate electrodes of the PG1 and PG2 are connected to Port A word line (port-A WL). Similarly, the source or drain electrodes of the PG3 and PG4 are connected to Port B bit lines BL-B and BL-B_bar. The gate electrodes of the PG3 and PG4 are connected to Port B word line (port-B WL). The other source and drain electrodes of the PG1, PG2, PG3, and PG4 (other than the ones connecting to the bit lines and the word lines) are coupled to the storage unit of the SRAM cell 200. In various embodiments, each of PU1, PU2, PD1, PD2, PG1, PG2, PG3, and PG4 may include one or more transistors for performance enhancement. One aspect of the present disclosure is related to the optimization of the metal routing among the PU1, PD1, PG1, and PG3 (indicated with the dashed circle 201), as well as of the metal routing among the PU2, PD2, PG2, and PG4 (indicated with the dashed circle 203), which will be discussed below.

Figure 3:
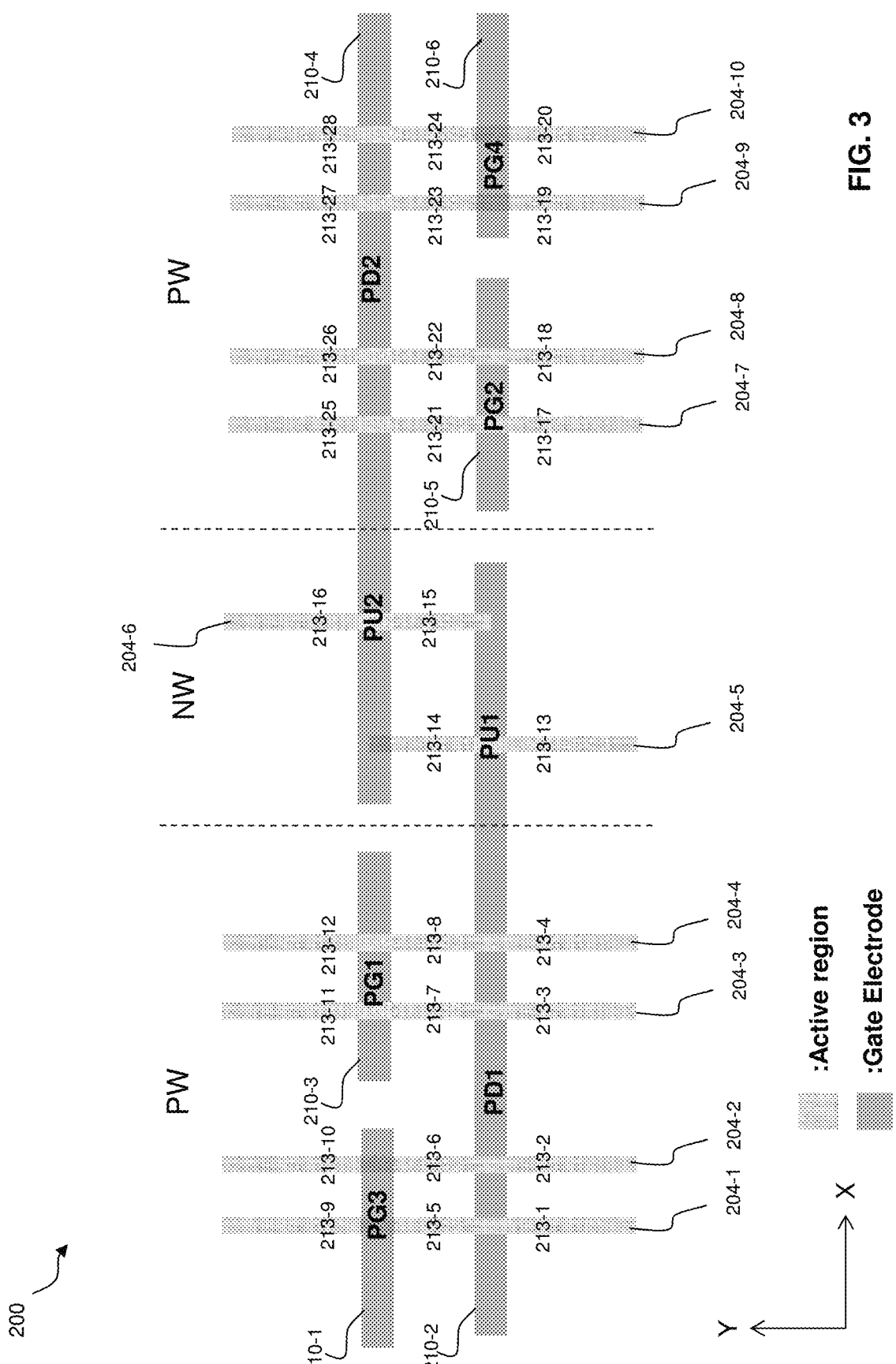
FIGS. 3, 4, 5, 7, 9, and 10 show a portion of a layout of the DP SRAM cell of the FIG. 2 from a top view, in accordance with some embodiments.

FIG. 3 shows a layout diagram of the DP SRAM cell 200 according to the present embodiment. For simplicity, the layout in FIG. 3 only shows active regions and gate electrodes. Referring to FIG. 3, the DP SRAM cell 200 includes active regions 204 such as the active regions 204-$n$ (where n=1~10) and gate electrodes 210 such as the gate electrodes 210-$m$ (where m=1~6). The active regions 204 are oriented lengthwise generally along a first direction Y, and the gate electrodes 210 are oriented lengthwise generally along a second direction X that is perpendicular to the first direction Y. The active regions 204 may include fins or fin active regions for FinFETs in an embodiment or may include vertically stacked multiple nanowires or nanosheets for GAA FETs in another embodiment. The active regions 204 may take other suitable forms or shapes. In the present embodiment, the active regions 204-1~4 are disposed over a p-type well, the active regions 204-7~10 are disposed over another p-type well, and the active regions 204-5~6 are disposed over an n-type well which is sandwiched between the two p-type wells.

The gate electrodes 210 may include high-k metal gate structures (i.e., having one or more metal layers over a high-k gate dielectric layer) in an embodiment, and may include other materials and/or configuration in various embodiments. The gate electrodes 210 are disposed over and engaging the active regions 204 to form the various transistors for the DP SRAM cell 200. Particularly, the gate electrode 210-1 engages the active regions 204-1 and 204-2 to form two n-type FETs (e.g., n-type FinFETs) to make up the pass gate transistor(s) PG3; the gate electrode 210-2 engages the active regions 204-1, 204-2, 204-3, and 204-4 to form four n-type FETs (e.g., n-type FinFETs) to make up the pulldown transistor(s) PD1; the gate electrode 210-2 also engages the active region 204-5 to form a p-type FET (e.g., p-type FinFET) as the pullup transistor PU1; the gate electrode 210-3 engages the active regions 204-3 and 204-4 to form two n-type FETs (e.g., n-type FinFETs) to make up the pass gate transistor(s) PG1; the gate electrode 210-4 engages the active regions 204-7, 204-8, 204-9, and 204-10 to form four n-type FETs (e.g., n-type FinFETs) to make up the pulldown transistor(s) PD2; the gate electrode 210-4 also engages the active region 204-6 to form a p-type FET (e.g., p-type FinFET) as the pullup transistor PU2; the gate electrode 210-5 engages the active regions 204-7 and 204-8 to form two n-type FETs (e.g., n-type FinFETs) to make up the pass gate transistor(s) PG2; and the gate electrode 210-6 engages the active regions 204-9 and 204-10 to form two n-type FETs (e.g., n-type FinFETs) to make up the pass gate transistor(s) PG4.

FIG. 3 also shows source/drain features 213 of the various transistors such as the source/drain features 213-$q$ (where q=1~28) formed on or in the active regions 204 on both sides of the gate electrodes 210. The source/drain features 213 may include n-type doped silicon or p-type silicon germanium in an embodiment and may be formed by doping, epitaxial growth, straining, or other techniques. Some of the transistors may share source/drain features. For example, the PG3 transistors and some of the PD1 transistors may share the source/drain features 213-5~6 formed on or in the active regions 204-1 and 204-2; the PG1 transistors and some of the PD1 transistors may share the source/drain features 213-7~8 formed on or in the active regions 204-3 and 204-4; the PG2 transistors and some of the PD2 transistors may share the source/drain features 213-21~22 formed on or in the active regions 204-7 and 204-8; and the PG4 transistors and some of the PD2 transistors may share the source/drain features 213-23~24 formed on or in the active regions 204-9 and 204-10.

Figure 4:
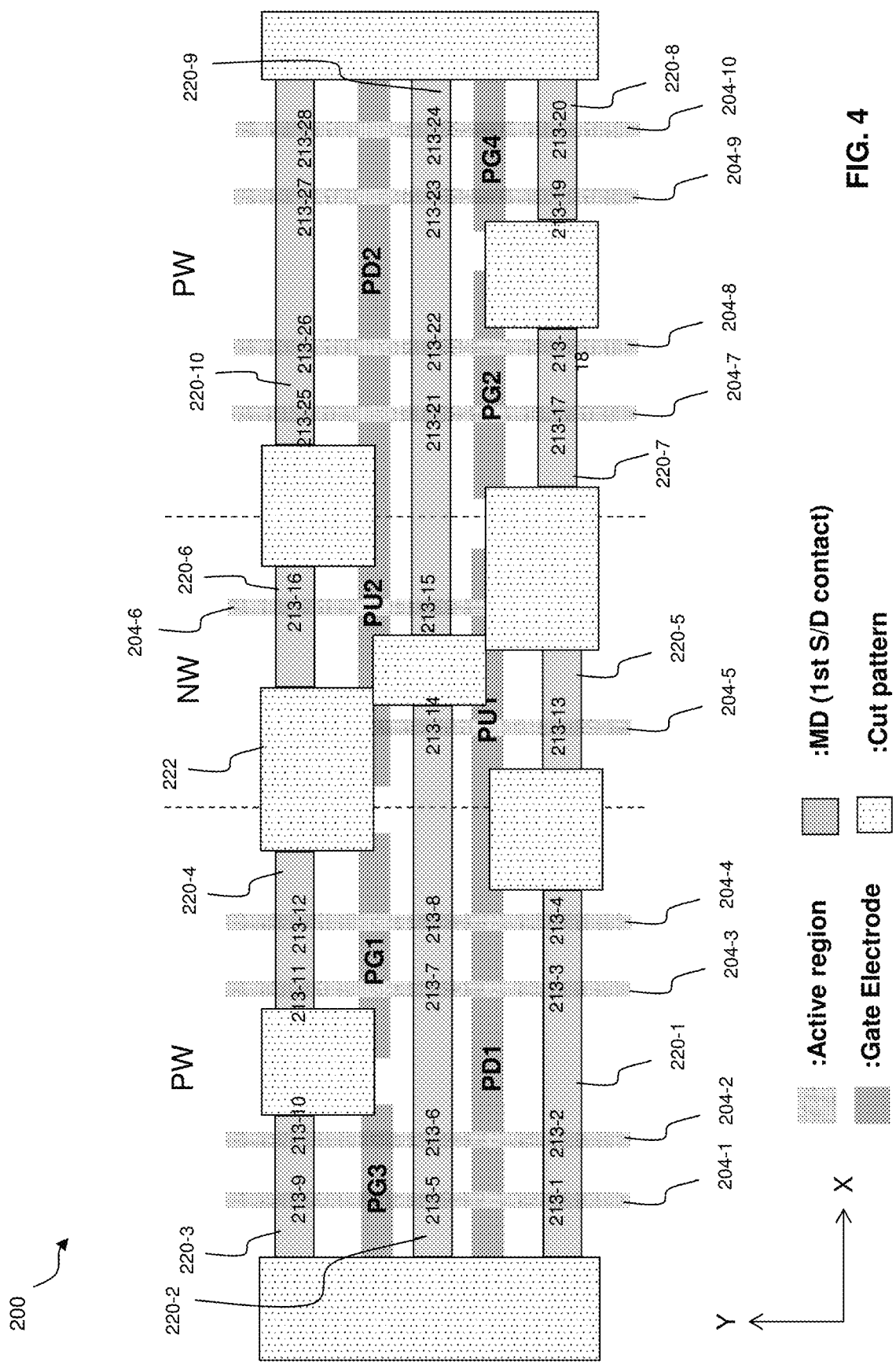

FIG. 4 shows a layout diagram of the DP SRAM cell 200 according to the present embodiment. The layout in FIG. 4 includes the active regions 204 and the gate electrodes 210 (which are not labeled in FIG. 4 for simplicity) as discussed above, and further includes source/drain contacts (or "MD") such as the source/drain contacts 220-$p$ (where p=1~10). The source/drain contacts 220 are oriented lengthwise generally along the direction X. FIG. 4 further illustrates various cut patterns 222 which may be used to produce the source/drain contacts 220. In one example, initial patterns for the source/drain contacts 220 are formed as three continuous pieces along the X direction, for example, using EUV lithography. Subsequently, the three continuous pieces are etched with an etch mask having the shape of the cut patterns 222. The remaining portions of the three continuous pieces become the final patterns for the source/drain contacts 220. The final patterns may be used for etching trenches in a dielectric layer to expose the source/drain features. Finally, one or more metals are filled into the trenches to form the source/drain contacts 220. Other methods of forming the source/drain contacts 220 are also possible. For example, the initial continuous patterns may be used for etching trenches in the dielectric layer to expose the source/drain features. Then, one or more metals are filled into the trenches and are subsequently etched (or cut) using the cut patterns 222.

Still referring to FIG. 4, the source/drain contacts 220 are disposed over and in contact with the various source/drain features 213 of the transistors in the DP SRAM cell 200. Particularly, the source/drain contact 220-1 are disposed over the source/drain features 213-1~4; the source/drain contact 220-2 are disposed over the source/drain features 213-5-8 and 213-14; the source/drain contact 220-3 are disposed over the source/drain features 213-9~10; the source/drain contact 220-4 are disposed over the source/drain features 213-11~12; the source/drain contact 220-5 are disposed over the source/drain features 213-13; the source/drain contact 220-6 are disposed over the source/drain features 213-16; the source/drain contact 220-7 are disposed over the source/drain features 213-17~18; the source/drain contact 220-8 are disposed over the source/drain features 213-19~20; the source/drain contact 220-9 are disposed over the source/drain features 213-15 and 213-21~24; and the source/drain contact 220-10 are disposed over the source/drain features 213-25~28. Particularly, each of the source/drain contacts 220 is formed as a continuous piece within one layer of the DP SRAM cell 200 and the connections among the source/drain features 213 are made using the source/drain contacts 220 and without using routing resources above the source/drain contacts, unlike other designs where some connection between the source/drain features is routed through one or more interconnect layer(s) above the source/drain contacts. With the simpler routing, the present embodiment provides a more compact design than other designs.

Figure 5:
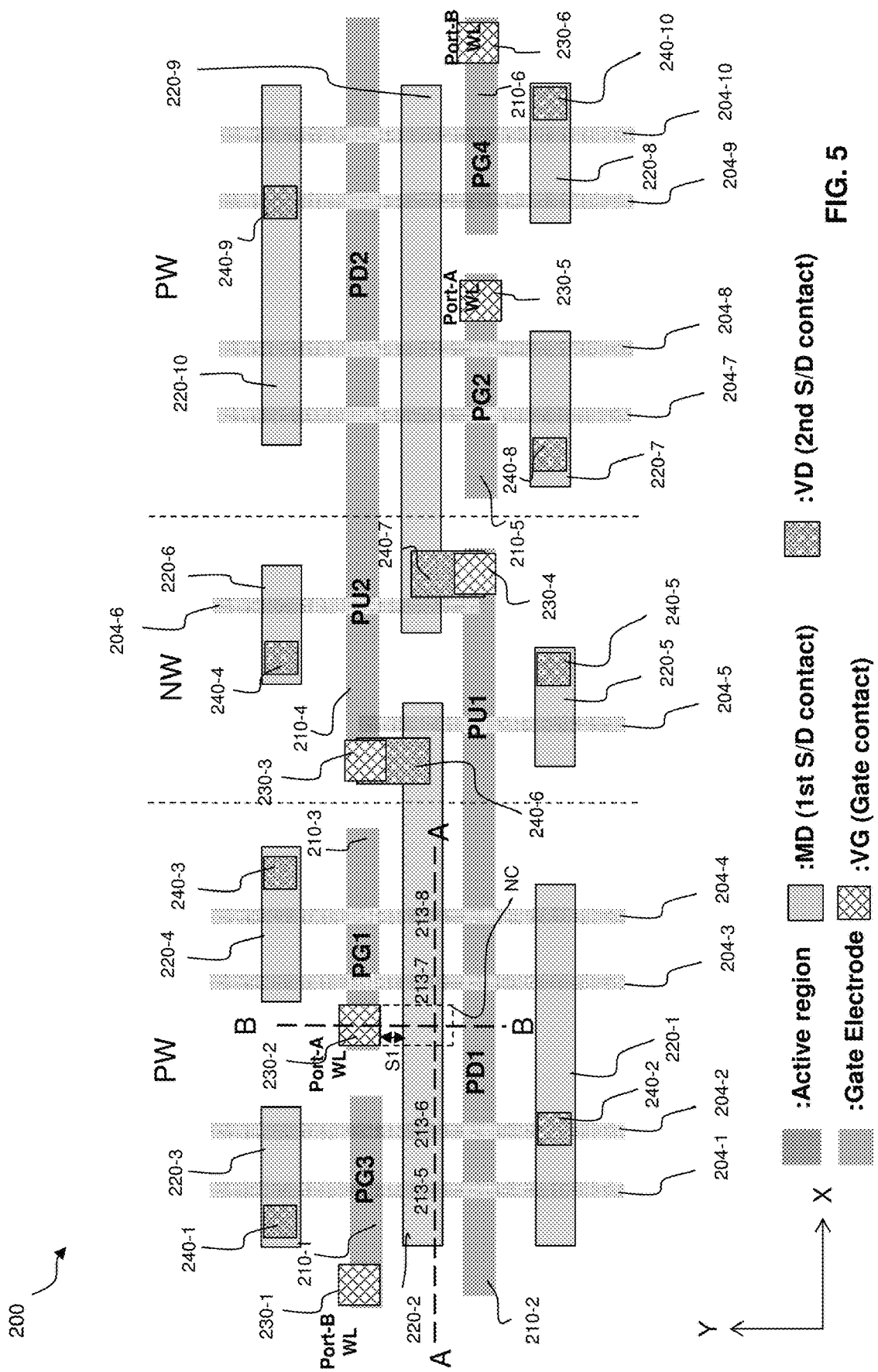

FIG. 5 shows a layout diagram of the DP SRAM cell 200 according to the present embodiment. The layout in FIG. 5 includes the active regions 204, the gate electrodes 210, the source/drain contacts 220 as discussed above, and further includes gate contacts (or "VG") 230 such as the gate contacts 230-r (where r=1~6) and source/drain via plugs (or "VD") 240 such as the source/drain via plugs 240-s (where s=1~10). For simplicity purposes, the source/drain features 213 are not labeled in FIG. 5 except for the source/drain features 213-5~8. The gate contacts 230 are disposed over and in direct contact with the gate electrodes 210. Particularly, the gate contacts 230-1, 230-2, 230-3, 230-4, 230-5, and 230-6 are disposed over and in direct contact with the gate electrodes 210-1, 210-3, 210-4, 210-2, 210-5, and 210-6, respectively.

Figures 6A, 6B:
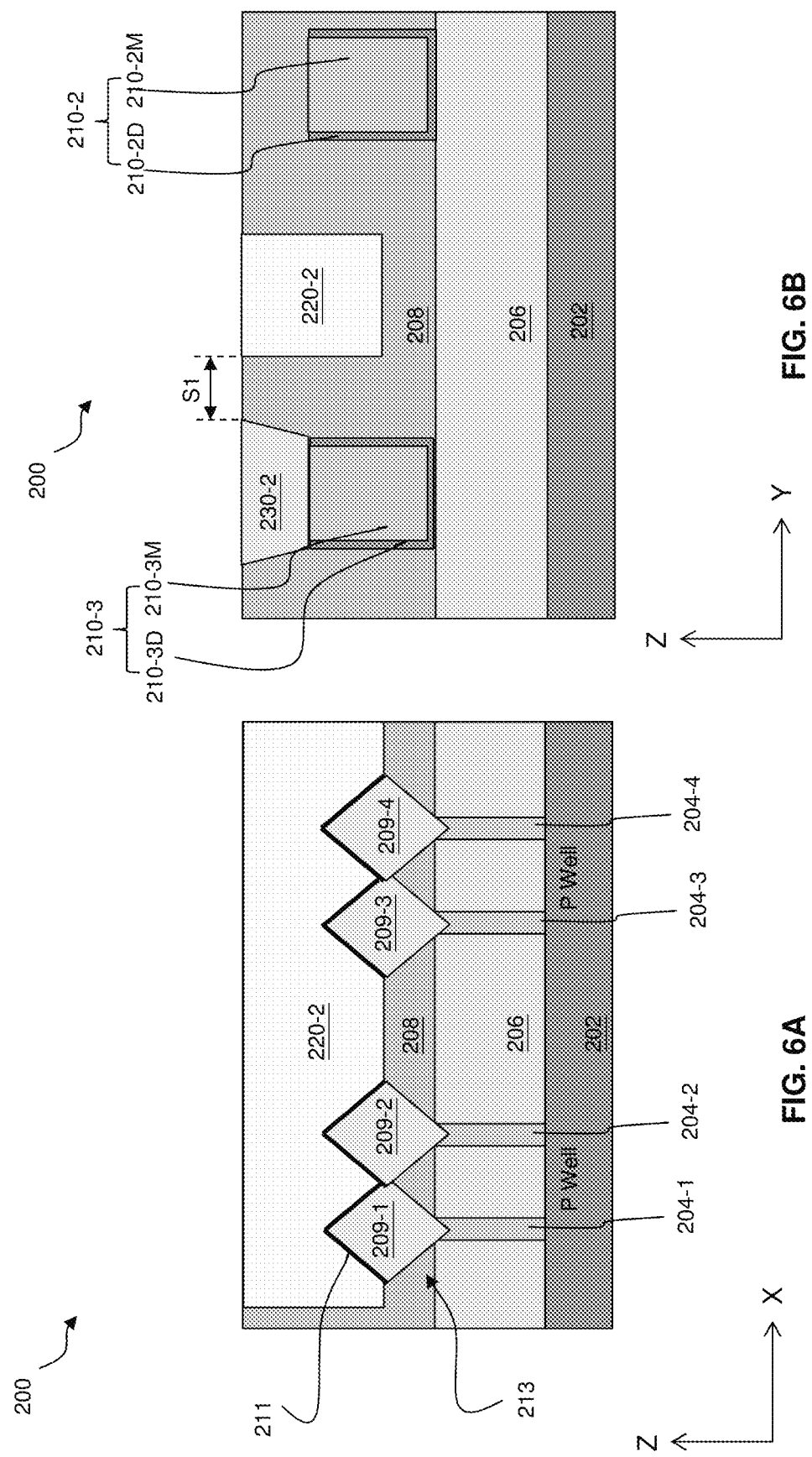
FIGS. 6A, 6B, 8A, and 8B show cross-sectional views of a portion of the DP SRAM cell of the FIG. 2, in accordance with some embodiments.

FIG. 6a shows a cross-sectional view of the DP SRAM cell 200 along the A-A line of FIG. 5. FIG. 6b shows a cross-sectional view of the DP SRAM cell 200 along the B-B line of FIG. 5. Referring to FIGS. 5, 6A, and 6B collectively, the DP SRAM cell 200 includes a substrate 202, over which the active regions 204 are formed. In this embodiment, the active regions 204 are fin active regions that are connected to the substrate 202. The DP SRAM cell 200 further includes an isolation structure 206 over the substrate 202 and isolating the various active regions 204.

The substrate 202 may include a silicon substrate (e.g., a silicon wafer) or another semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. The substrate 202 may include a silicon-on-insulator (SOI) substrate in some embodiment. The substrate 202 includes various doped structures (such as the P wells or N wells) and may be strained or stressed for performance enhancement.

The fin active regions 204 may comprise one or more semiconductor materials such as silicon, germanium, or other suitable semiconductor material(s). In an embodiment, the fin active regions 204 may include alternately stacked layers of two different semiconductor materials, such as layers of silicon and layers of silicon germanium alternately stacked. The fin active regions 204 may additionally include n-type dopant(s) such as phosphorus or arsenic, or p-type dopant(s) such as boron or indium.

The isolation structure 206 may comprise silicon oxide, silicon nitride, silicon oxynitride, fluorosilicate glass (FSG), a low-k dielectric material, and/or other suitable insulating material. The isolation structure 206 may be shallow trench isolation (STI) features. Other isolation structure such as field oxide, LOCal Oxidation of Silicon (LOCOS), and/or other suitable structures are possible. The isolation structure 206 may include a multi-layer structure, for example, having one or more thermal oxide liner layers adjacent to the fin active regions 204.

In the present embodiment, the source/drain features 213 include a doped semiconductor layer 209 and further include a silicide layer 211 over the doped semiconductor layer 209. FIG. 6A shows example doped semiconductor layer 209-1~4. Adjacent semiconductor layer 209 may merge (as shown in FIG. 6A) or may be separate. The doped semiconductor layer 209 may include epitaxially grown silicon with an n-type dopant, epitaxially grown silicon germanium with a p-type dopant, or other suitable material(s). The silicide layer 211 may include titanium silicide, nickel silicide, cobalt silicide, tungsten silicide, or other silicidation.

Each of the gate electrodes 210 includes a gate metal layer over a gate dielectric layer. FIG. 6B illustrates the gate electrodes 210-2 and 210-3, wherein the gate electrode 210-2 includes a gate metal layer 210-2M over a gate dielectric layer 210-2D, and the gate electrode 210-3 includes a gate metal layer 210-3M over a gate dielectric layer 210-3D. The gate dielectric layers 210-2D and 210-3D may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The gate metal layers 210-2M and 210-3M may include one or more metal layers, such as work function metal layer(s), conductive barrier layer(s), and metal fill layer(s). The work function metal layer may be a p-type or an n-type work function layer depending on the type (PFET or NFET) of the device. The p-type work function layer may be selected from but not limited to the group of titanium nitride (TiN), tantalum nitride (TaN), ruthenium (Ru), molybdenum (Mo), tungsten (W), platinum (Pt), or combinations thereof. The n-type work function layer may be selected from but not limited to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials.

The DP SRAM cell 200 further includes a dielectric layer 208 over the isolation structure 206 and covering the source/drain features 213 and the gate electrodes 210. The dielectric layer 208 may include one or more dielectric materials, such as silicon nitride, silicon oxide, silicon oxynitride, fluorosilicate glass (FSG), a low-k dielectric material, and/or other suitable insulating material. The source/drain contact features 220 (with 220-2 shown in FIGS. 6A and 6B) are disposed in the dielectric layer 208. The gate contacts 230 (with 230-2 shown in FIG. 6B) are also disposed in the dielectric layer 208. In an embodiment, at least a part of the source/drain contact 220-2 is disposed at a vertical level that is the same as or below a top surface of the gate contact 230-2. In a further embodiment, the entirety of the source/drain contact 220-2 is disposed at a vertical level that is the same as or below a top surface of the gate contact 230-2.

In the present embodiment, a portion of the source/drain contact 220-2 and a portion of the gate contact 230-2 are at the same level vertically from a top surface of the substrate 202 and are aligned along the direction Y (see FIG. 5 line B-B, and FIG. 6B). The spacing S1 between the gate contact 230-2 and the source/drain contact 220-2 along the direction Y is smaller than a resolution achievable by a single exposure in the 193-nm immersion lithography but equal to or greater than a resolution achievable by the EUV lithography. For example, the spacing S1 is made less than 40 nm in an embodiment, such as less than 20 nm or less than 10 nm. In some designs, the source/drain contacts on the source/drain features 213-5~8 are made into several separate pieces at the contact level in order to avoid shorting with the gate contact 230-2. Particularly, in those designs, the source/drain contacts on the source/drain features 213-5~8 do not extend into the area NC (indicated by the dashed box in FIG. 5), which is an area extending from the gate contact 230-2 along the Y direction towards the gate electrode 210-2. To connect the source/drain features 213-5~6 and the source/drain features 213-7~8, those designs would need routing from higher interconnect layers. In the present embodiment, the source/drain contact 220-2 and the gate contact 230-2 are defined using advanced lithography such as EUV lithography. Thus, the source/drain contact 220-2 can extend through the NC area without the concern of shorting to the gate contact 230-2 even when the spacing S1 is less than 40 nm such as less than 20 nm. This advantageously simplifies the interconnect routing of the DP SRAM cell 200, reduces source/drain interconnect resistance, and frees up metal layer routing resources for other signals such as power, ground, bit lines, and word lines. The discussion above about the source/drain contact 220-2 and the gate contact 230-2 applies equally to the source/drain contact 220-9 and the gate contact 230-5. The source/drain via plugs 240 are disposed over the various source/drain contacts 220. The source/drain via plugs 240 may be disposed at the same vertical level as or higher than the gate contacts 230.

Figure 7:
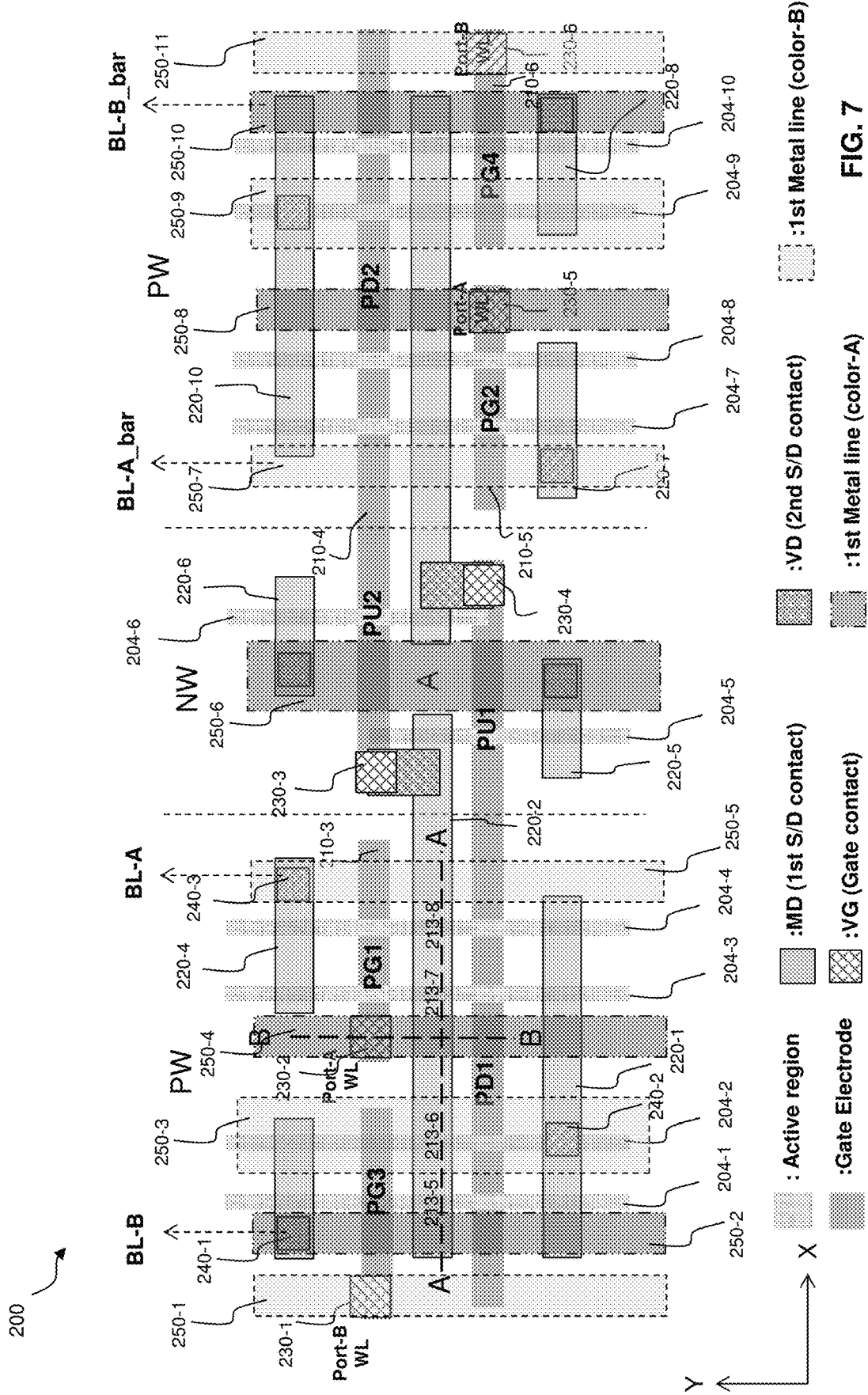

FIG. 7 shows a layout diagram of the DP SRAM cell 200 according to the present embodiment. The layout in FIG. 7 includes the active regions 204, the gate electrodes 210, the source/drain contacts 220, the gate contacts 230, and the source/drain via plugs 240 as discussed above, and further includes metal lines 250 such as the metal lines 250-1~11. For simplicity purposes, not all features are labeled in FIG. 7. In the present embodiment, the metal lines 250-1, 250-3, 250-5, 250-7, 250-9, and 250-11 and the metal lines 250-2, 250-4, 250-6, 250-8, and 250-10 are defined with separate patterning process in a double-patterning process (one with color-B and the other with color-A). Alternatively, the metal lines 250-1~11 can be defined with a single patterning process. The metal lines 250-1~11 are oriented lengthwise generally along the Y direction.

The metal line 250-1 is disposed over and connected to the gate contact 230-1 and is part of the Port B Word line routing. The metal line 250-2 is disposed over and connected to the source/drain via plug 240-1. The metal line 250-2 is part of the bit line BL-B routing. The metal line 250-3 is disposed over and connected to the source/drain via plug 240-2 which is connected to the source/drain contact 220-1. The metal line 250-4 is disposed over and connected to the gate contact 230-2. The metal line 250-5 is disposed over and connected to the source/drain via plug 240-3. The metal line 250-5 is part of the bit line BL-A routing. Similarly, the metal lines 250-7 and 250-10 are part of the bit lines BL-A_bar and BL-B_bar routing respectively. The metal line 250-6 is connected to the source/drain contacts 220-5 and 220-6. The metal line 250-7 is connected to the source/drain contact 220-7. The metal line 250-8 is connected to the gate electrode 210-5. The metal line 250-9 is connected to the source/drain contact 220-10. The metal line 250-10 is connected to the source/drain contact 220-8. The metal line 250-11 is connected to the gate electrode 210-6.

In the present embodiment, the metal lines 250-3 and 250-9 are ground (Vss) lines, which are made extra wide for performance enhancement (such as reducing resistance to ground and reducing ground bounce). Particularly, the metal line 250-3 is directly above the active region 204-2 and is wider than the active region 204-2. Still further, the metal line 250-3 extends past both edges of the active region 204-2 along the direction X from the top view. Having an extra wide metal line 250-3 is a direct benefit of making the source/drain contact 220-2 a continuous piece at the source/drain contact level. In some designs, the source/drain features 213-5-6 and 213-7-8 are not connected at the source/drain contact level but through routings at metal layer(s). In those designs, the space between the metal lines 250-2 and 250-4 would be partially occupied by a metal line for connecting the source/drain features 213-5~6 and 213-7~8. Consequently, the space for the metal line 250-3 in those designs would be smaller than the present embodiment. Similarly, the metal line 250-9, which is also a ground line (Vss) for the DP SRAM cell 200, is made extra wide in the present embodiment for performance enhancement. The discussion above about the metal line 250-3 with respect to the active region 204-2 applies equally to the metal line 250-9 with respect to the active region 204-9.

Figure 8B:
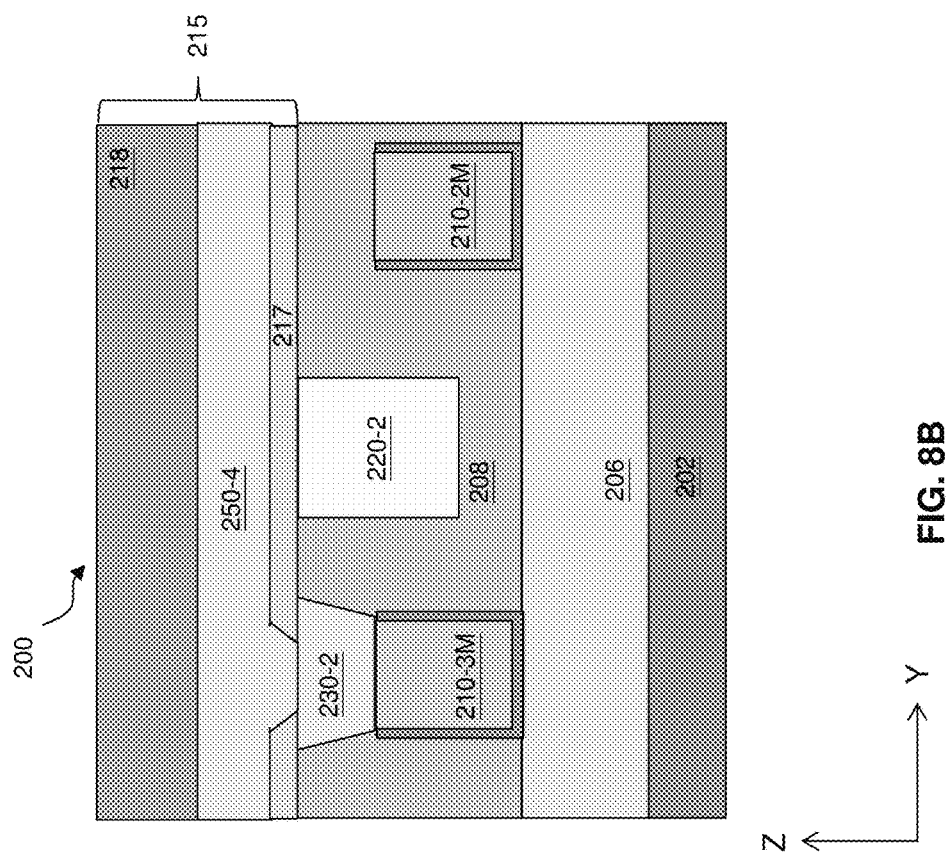
Figure 8A:
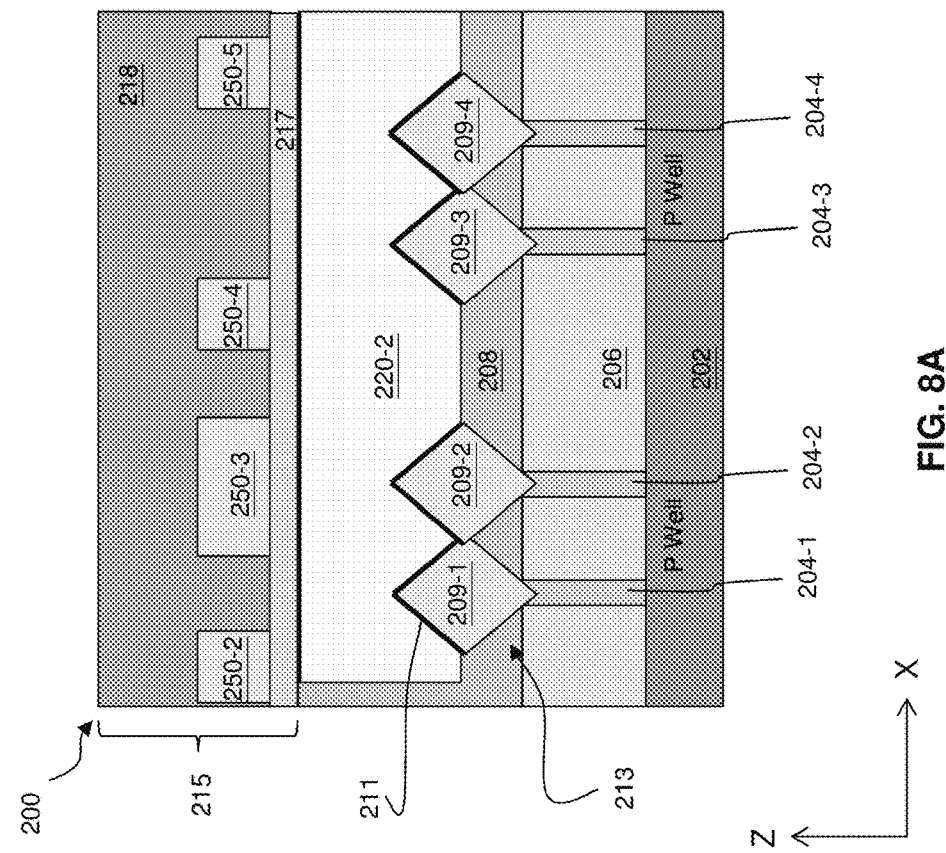

FIG. 8A shows a cross-sectional view of the DP SRAM cell 200 along the A-A line of FIG. 7. FIG. 8B shows a cross-sectional view of the DP SRAM cell 200 along the B-B line of FIG. 7. FIGS. 8A and 8B include all the features of FIGS. 6A and 6B, and further include an interconnect layer (or Metal-1 layer) 215 having the metal lines 250. Referring to FIGS. 8A and 8B, in the present embodiment, the interconnect layer 215 includes an etch stop layer 217 and an ILD layer 218 over the etch stop layer 217. The metal lines 250 (with 250-2~5 shown in FIG. 8A) are embedded in the ILD layer 218. The etch stop layer 217 may comprise silicon nitride, silicon oxynitride, silicon nitride with oxygen (O) or carbon (C) elements, and/or other materials. The ILD layer 218 may comprise tetraethylorthosilicate (TEOS) oxide, un-doped silicate glass, or doped silicon oxide such as borophosphosilicate glass (BPSG), fluorosilica glass (FSG), phosphosilicate glass (PSG), boron doped silicon glass (BSG), and/or other suitable dielectric materials. The metal lines 250 may comprise copper, gold, tungsten, ruthenium, cobalt, or other suitable materials. The metal lines 250 may be formed by damascene processes. As shown in FIG. 8A, the metal line 250-3 is directly above the active region 204-2 in this embodiment.

Figure 9:
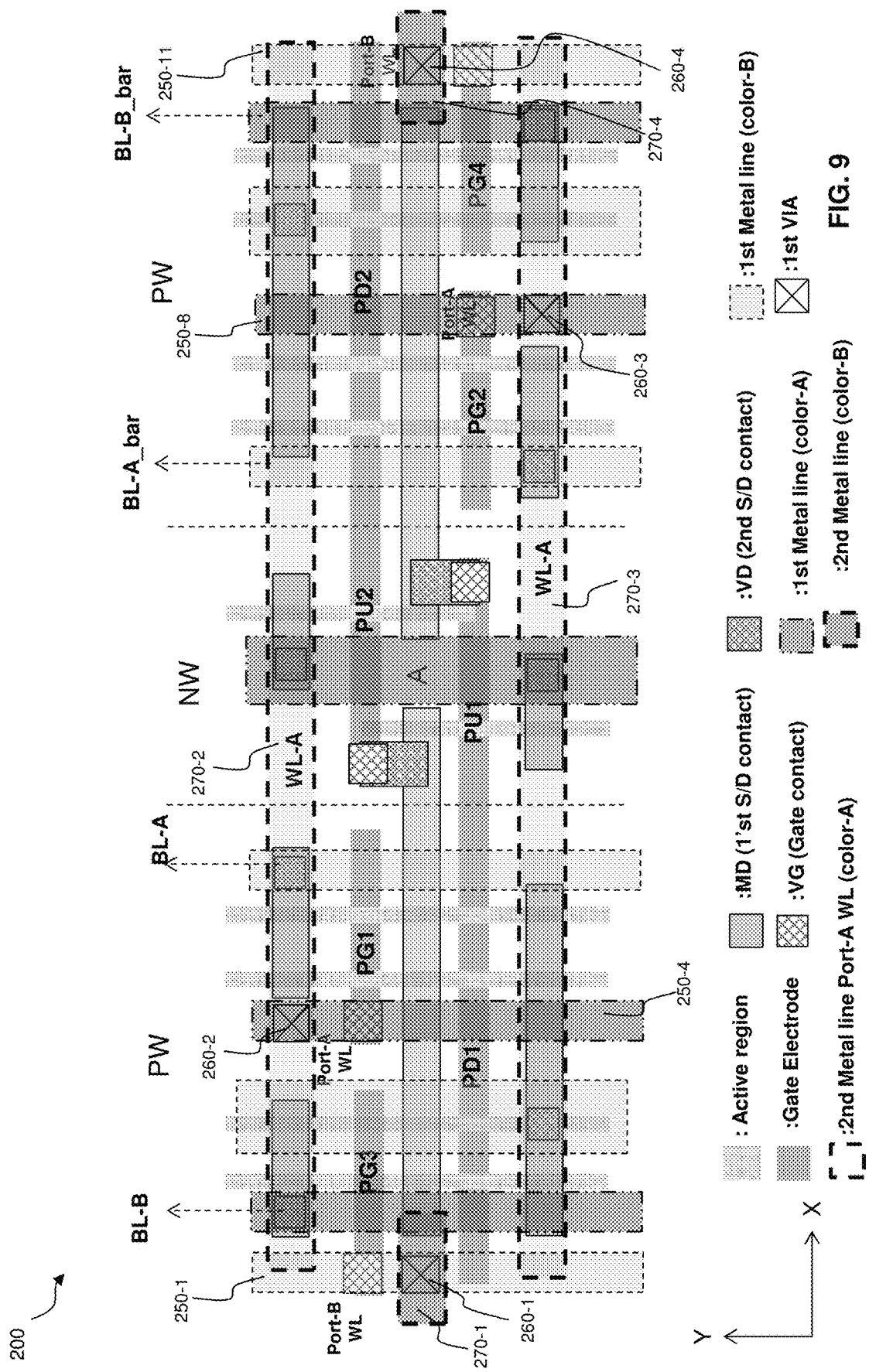

FIG. 9 shows a layout diagram of the DP SRAM cell 200 according to the present embodiment. The layout in FIG. 9 includes all the features shown in FIGS. 3, 4, 5, and 7, and further includes vias 260 (such as 260-1~4) disposed on the metal lines 250 and metal lines 270 (such as 270-1~4) disposed over the vias 260. Particularly, the vias 260-1, 260-2, 260-3, and 260-4 are disposed over and connected to the metal lines 250-1, 250-4, 250-8, and 250-11 respectively; and the metal lines 270-1, 270-2, 270-3, and 270-4 are disposed over and connected to the vias 260-1, 260-2, 260-3, and 260-4 respectively. The metal lines 270 are oriented lengthwise generally along the direction X. The vias 260 and the metal lines 270 are disposed in an interconnect layer (not shown) above the interconnect layer 215, such as a Metal-2 interconnect layer. Particularly, the metal lines 270-2 and 270-3 are part of the Port A Word line routing. The metal lines 270 may be defined using a double patterning process where the metal lines 270-1 and 270-4 are defined in one patterning process, and the metal lines 270-2 and 270-3 are defined in another patterning process. Alternatively, the metal lines 270 may be defined using a single patterning process. For simplicity purposes, not all features are labeled in FIG. 9.

Figure 10:
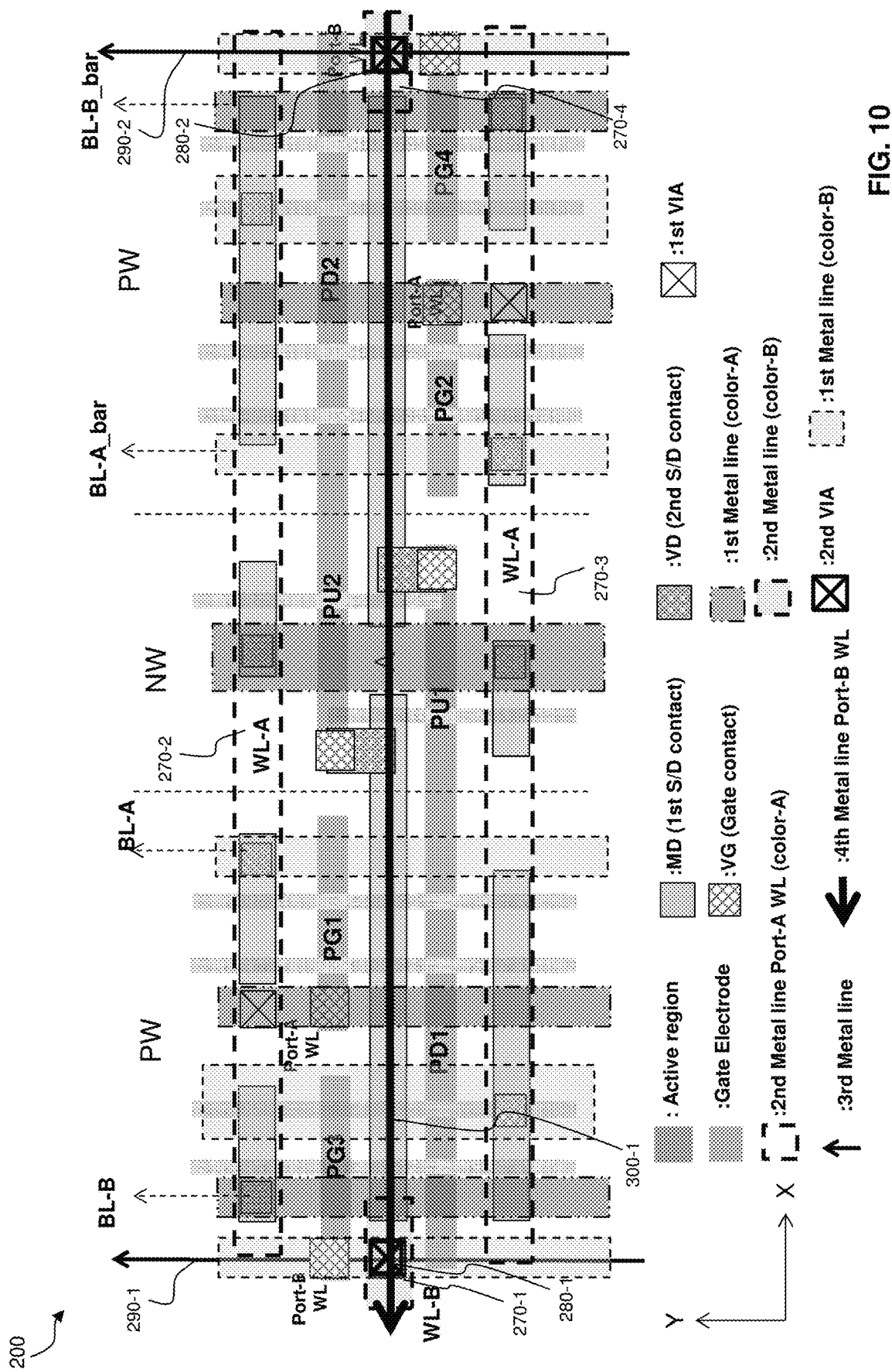

FIG. 10 shows a layout diagram of the DP SRAM cell 200 according to the present embodiment. The layout in FIG. 10 includes all the features shown in FIGS. 3, 4, 5, 7, and 9, and further includes second level vias 280-1 and 280-2 disposed over the second level metal lines 270-1 and 270-4 respectively, and third level metal lines 290-1 and 290-2 disposed over the second level vias 280-1 and 280-2. The third level metal lines 290-1 and 290-2 are oriented lengthwise generally along the direction Y. The layout in FIG. 10 further includes a fourth level metal line 300-1, which is part of the Port B Word line routing. Connection from the fourth level metal line 300-1 to the lower level(s) (such as the metal lines 290-1 and 290-2) is made through third level vias (not shown).

Although not intended to be limiting, the present disclosure provides many benefits. For example, the present disclosure provides a compact design for a DP SRAM cell. In this design, the source/drain features of the pass gate transistors and the pulldown transistors of the same port (either Port A or Port B) are connected through a single source/drain contact without using higher level routing resources. The space between this source/drain contact and nearby gate contacts can be made very small. This results in a very compact layout at the contact level. Further, due to the simple routing at the contact level, some routing resources at higher interconnect layer(s), such as Metal-1 layer, are freed up for other signals such as power lines, ground lines, bit lines, and word lines, thereby reducing resistance on those lines. Particular, the ground lines can be made extra wide to reduce resistance to ground, thereby improving performance of the DP SRAM cell.

In one exemplary aspect, the present disclosure is directed to a dual-port SRAM. The dual-port SRAM includes a substrate; a first active region and a second active region over the substrate and oriented lengthwise generally along a first direction; a first gate electrode and a second gate electrode over the substrate and oriented lengthwise generally along a second direction perpendicular to the first direction. The first gate electrode engages the first active region to form a first pass gate transistor of the dual-port SRAM, and the second gate electrode engages the second active region to form a second pass gate transistor of the dual-port SRAM. The dual-port SRAM further includes a first gate contact disposed over the first gate electrode and electrically connected to the first gate electrode and a first source/drain contact oriented lengthwise generally along the second direction. The first source/drain contact directly contacts a source/drain feature of the first pass gate transistor and a source/drain feature of the second pass gate transistor. A portion of the first gate contact and a portion of the first source/drain contact are at a same vertical level from a top surface of the substrate and are aligned along the first direction.

In an embodiment of the dual-port SRAM, a distance from the portion of the first gate contact to the portion of the first source/drain contact along the first direction is less than 40 nm. In a further embodiment, the distance is less than 20 nm.

In an embodiment, the dual-port SRAM further includes a third active region and a fourth active region over the substrate and oriented lengthwise generally along the first direction. The first gate electrode engages the third active region to form a third transistor of the dual-port SRAM. The second gate electrode engages the fourth active region to form a fourth transistor of the dual-port SRAM. The first source/drain contact is disposed over a source/drain feature of the third transistor and a source/drain feature of the fourth transistor.

In an embodiment of the dual-port SRAM, at least a part of the first source/drain contact is disposed at a vertical level that is same as or below a top surface of the first gate contact.

In another embodiment, the dual-port SRAM further includes a first interconnect layer over the first gate contact and the first source/drain contact. The first interconnect layer includes a first metal line and a second metal line oriented lengthwise generally along the first direction, the first metal line is directly above and connected to the first gate contact, and the second metal line is directly above the second active region. In a further embodiment, the dual-port SRAM further includes a third gate electrode over the substrate and oriented lengthwise generally along the second direction. The third gate electrode engages the first active region to form a first pulldown transistor of the dual-port SRAM and engages the second active region to form a second pulldown transistor of the dual-port SRAM. The dual-port SRAM further includes a second source/drain contact oriented lengthwise generally along the second direction. The second source/drain contact directly contacts a source/drain feature of the first pulldown transistor and a source/drain feature of the second pulldown transistor. The dual-port SRAM further includes a via plug disposed between and electrically connecting the second source/drain contact and the second metal line. In a further embodiment, the dual-port SRAM of claim 6 further includes a metal-to-metal via plug disposed over the first metal line and a third metal line disposed directly over the metal-to-metal via plug and oriented lengthwise generally along the second direction.

In some embodiment of the dual-port SRAM, each of the source/drain feature of the first pass gate transistor and the source/drain feature of the second pass gate transistor includes a silicide feature over a semiconductor layer, wherein the first source/drain contact directly contacts the silicide feature.

In some embodiment of the dual-port SRAM, the first and the second active regions include fin active regions and the first and the second pass gate transistors include FinFETs.

In another exemplary aspect, the present disclosure is directed to a dual-port SRAM cell. The dual-port SRAM cell includes a first pass gate transistor and a second pass gate transistor over a substrate. The first pass gate transistor includes a portion of a first gate electrode engaging a portion of a first active region. The second pass gate transistor includes a portion of a second gate electrode engaging a portion of a second active region. The first and the second gate electrodes are connected to different word lines of the dual-port SRAM cell. The first and the second active regions are oriented lengthwise generally along a first direction. The first and the second gate electrodes are oriented lengthwise generally along a second direction perpendicular to the first direction. The dual-port SRAM cell further includes a first gate contact disposed over the first gate electrode and a first source/drain contact oriented lengthwise generally along the second direction. The first source/drain contact is disposed over both a source/drain feature of the first pass gate transistor and a source/drain feature of the second pass gate transistor. The first source/drain contact is disposed at a vertical level that is same as or below a top surface of the first gate contact.

In an embodiment of the dual-port SRAM cell, the source/drain feature of the first pass gate transistor is also a source/drain feature of a first pulldown transistor of the dual-port SRAM cell, and the source/drain feature of the second pass gate transistor is also a source/drain feature of a second pulldown transistor of the dual-port SRAM cell.

In an embodiment of the dual-port SRAM cell, a portion of the first gate contact and a portion of the first source/drain contact are at a same vertical level from a top surface of the substrate and are spaced away from each other less than 20 nm along the first direction.

In an embodiment, the dual-port SRAM cell further includes a first metal line and a second metal line oriented lengthwise generally along the first direction. The first metal line is directly above and connected to the first gate contact. The second metal line is directly above the second active region and is wider than the second active region. In a further embodiment, the dual-port SRAM cell further includes an interconnect via plug disposed over the first metal line and a third metal line oriented lengthwise generally along the second direction and disposed directly over the interconnect via plug. The third metal line is one of the word lines of the dual-port SRAM cell. In another embodiment, the dual-port SRAM cell further includes a second gate contact disposed over the second gate electrode and a third metal line oriented lengthwise generally along the first direction, wherein the third metal line is directly above and connected to the second gate contact.

In an embodiment of the dual-port SRAM cell, the second metal line is wider than the first metal line.

In yet another exemplary aspect, the present disclosure is directed to a layout of a dual-port SRAM cell. The layout includes first, second, third, and fourth active regions over a p-type well, wherein each of the first, the second, the third, and the fourth active regions is oriented lengthwise generally along a first direction. The layout further includes a first gate electrode over the first and the second active regions; a second gate electrode over the third and the fourth active regions; and a third gate electrode over the first, the second, the third, and the fourth active regions. Each of the first, the second, and the third gate electrodes is oriented lengthwise generally along a second direction perpendicular to the first direction. The layout further includes a source/drain contact feature disposed between the first gate electrode and the third gate electrode and between the second gate electrode and the third gate electrode from a top view. The source/drain contact feature contacts a first source/drain feature on the first active region, a second source/drain feature on the second active region, a third source/drain feature on the third active region, and a fourth source/drain feature on the fourth active region. In an embodiment, the layout further includes a gate contact disposed over the first gate electrode. In a further embodiment, a distance from the gate contact to the source/drain contact along the first direction is less than 20 nm.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A dual-port SRAM, comprising:
    a substrate;
    a first active region and a second active region over the substrate and oriented lengthwise generally along a first direction;
    a first gate electrode and a second gate electrode over the substrate and oriented lengthwise generally along a second direction perpendicular to the first direction, wherein the first gate electrode engages the first active region to form a first pass gate transistor of the dual-port SRAM, and the second gate electrode engages the second active region to form a second pass gate transistor of the dual-port SRAM;
    a first gate contact disposed over the first gate electrode and electrically connected to the first gate electrode; and
    a first source/drain contact oriented lengthwise generally along the second direction, the first source/drain contact directly contacting a source/drain feature of the first pass gate transistor and a source/drain feature of the second pass gate transistor, wherein a portion of the first gate contact and a portion of the first source/drain contact are at a same vertical level from a top surface of the substrate and are on a straight line along the first direction in a plan view.

2. The dual-port SRAM of claim 1, wherein a distance from the portion of the first gate contact to the portion of the first source/drain contact along the first direction is less than 40 nm.

3. The dual-port SRAM of claim 2, wherein the distance is less than 20 nm.

4. The dual-port SRAM of claim 1, further comprising:
    a third active region and a fourth active region over the substrate and oriented lengthwise generally along the first direction, wherein the first gate electrode engages the third active region to form a third transistor of the dual-port SRAM, and the second gate electrode engages the fourth active region to form a fourth transistor of the dual-port SRAM, wherein the first source/drain contact is disposed over a source/drain feature of the third transistor and a source/drain feature of the fourth transistor.

5. The dual-port SRAM of claim 1, wherein at least a part of the first source/drain contact is disposed at a vertical level that is same as or below a top surface of the first gate contact.

6. The dual-port SRAM of claim 1, further comprising:
    a first interconnect layer over the first gate contact and the first source/drain contact, wherein the first interconnect layer includes a first metal line and a second metal line oriented lengthwise generally along the first direction, the first metal line is directly above and connected to the first gate contact, and the second metal line is directly above the second active region.

7. The dual-port SRAM of claim 6, further comprising:
    a third gate electrode over the substrate and oriented lengthwise generally along the second direction, wherein the third gate electrode engages the first active region to form a first pulldown transistor of the dual-port SRAM, and the third gate electrode engages the second active region to form a second pulldown transistor of the dual-port SRAM;
    a second source/drain contact oriented lengthwise generally along the second direction, the second source/drain contact directly contacting a source/drain feature of the first pulldown transistor and a source/drain feature of the second pulldown transistor; and
    a via plug disposed between and electrically connecting the second source/drain contact and the second metal line.

8. The dual-port SRAM of claim 6, further comprising:
a metal-to-metal via plug disposed over the first metal line; and
a third metal line disposed directly over the metal-to-metal via plug and oriented lengthwise generally along the second direction.

9. The dual-port SRAM of claim 1, wherein each of the source/drain feature of the first pass gate transistor and the source/drain feature of the second pass gate transistor includes a silicide feature over a semiconductor layer, wherein the first source/drain contact directly contacts the silicide feature.

10. The dual-port SRAM of claim 1, wherein the first and the second active regions include fin active regions and the first and the second pass gate transistors include FinFETs.

11. A dual-port SRAM cell, comprising:
a first pass gate transistor and a second pass gate transistor over a substrate,
wherein the first pass gate transistor includes a portion of a first gate electrode engaging a portion of a first active region, the second pass gate transistor includes a portion of a second gate electrode engaging a portion of a second active region, the first and the second gate electrodes are connected to different word lines of the dual-port SRAM cell, wherein the first and the second active regions are oriented lengthwise generally along a first direction, the first and the second gate electrodes are oriented lengthwise generally along a second direction perpendicular to the first direction;
a first gate contact disposed over the first gate electrode;
a first source/drain contact oriented lengthwise generally along the second direction, the first source/drain contact disposed over both a source/drain feature of the first pass gate transistor and a source/drain feature of the second pass gate transistor, wherein the first source/drain contact is disposed at a vertical level that is same as or below a top surface of the first gate contact; and
a first metal line and a second metal line oriented lengthwise generally along the first direction, wherein the first metal line is directly above and connected to the first gate contact, and the second metal line is directly above the second active region and is wider than the second active region.

12. The dual-port SRAM cell of claim 11, wherein the source/drain feature of the first pass gate transistor is also a source/drain feature of a first pulldown transistor of the dual-port SRAM cell, and the source/drain feature of the second pass gate transistor is also a source/drain feature of a second pulldown transistor of the dual-port SRAM cell.

13. The dual-port SRAM cell of claim 11, wherein a portion of the first gate contact and a portion of the first source/drain contact are at a same vertical level from a top surface of the substrate and are spaced away from each other less than 20 nm along the first direction.

14. The dual-port SRAM cell of claim 11, further comprising:
an interconnect via plug disposed over the first metal line; and
a third metal line oriented lengthwise generally along the second direction and disposed directly over the interconnect via plug, wherein the third metal line is one of the word lines of the dual-port SRAM cell.

15. The dual-port SRAM cell of claim 11, further comprising:
a second gate contact disposed over the second gate electrode; and
a third metal line oriented lengthwise generally along the first direction, wherein the third metal line is directly above and connected to the second gate contact.

16. The dual-port SRAM cell of claim 11, wherein the second metal line is wider than the first metal line.

17. The dual-port SRAM cell of claim 11, wherein a portion of the first gate contact and a portion of the first source/drain contact are on a straight line that is parallel to the first direction from a plan view.

18. A layout of a dual-port SRAM cell, comprising:
first, second, third, and fourth active regions over a p-type well, wherein each of the first, the second, the third, and the fourth active regions is oriented lengthwise generally along a first direction;
a first gate electrode over the first and the second active regions;
a second gate electrode over the third and the fourth active regions;
a third gate electrode over the first, the second, the third, and the fourth active regions, wherein each of the first, the second, and the third gate electrodes is oriented lengthwise generally along a second direction perpendicular to the first direction; and
a source/drain contact feature disposed between the first gate electrode and the third gate electrode and between the second gate electrode and the third gate electrode from a top view, wherein the source/drain contact feature contacts a first source/drain feature on the first active region, a second source/drain feature on the second active region, a third source/drain feature on the third active region, and a fourth source/drain feature on the fourth active region.

19. The layout of claim 18, further comprising a gate contact disposed over the first gate electrode.

20. The layout of claim 19, wherein a distance from the gate contact to the source/drain contact feature along the first direction is less than 20 nm.

* * * * *